United States Patent
Madia et al.

(10) Patent No.: US 11,664,222 B2
(45) Date of Patent: May 30, 2023

(54) ATOMIC LAYER DEPOSITION OF INDIUM GALLIUM ZINC OXIDE

(71) Applicant: ASM IP Holding B.V., Almere (NL)

(72) Inventors: Oreste Madia, Leuven (BE); Andrea Illiberi, Leuven (BE); Michael Eugene Givens, Helsinki (FI); Tatiana Ivanova, Espoo (FI); Charles Dezelah, Helsinki (FI); Varun Sharma, Helsinki (FI)

(73) Assignee: ASM IP Holding, B.V., Almere (NL)

( * ) Notice: Subject to any disclaimer, the term of this patent is extended or adjusted under 35 U.S.C. 154(b) by 89 days.

(21) Appl. No.: 17/072,525

(22) Filed: Oct. 16, 2020

(65) Prior Publication Data

US 2021/0118672 A1    Apr. 22, 2021

Related U.S. Application Data

(60) Provisional application No. 62/916,476, filed on Oct. 17, 2019.

(51) Int. Cl.
*H01L 21/02* (2006.01)

(52) U.S. Cl.
CPC .... *H01L 21/0262* (2013.01); *H01L 21/02565* (2013.01); *H01L 21/02639* (2013.01)

(58) Field of Classification Search
CPC ........... H01L 21/0262; H01L 21/02565; H01L 21/02639; H01L 21/02554;

(Continued)

(56) References Cited

U.S. PATENT DOCUMENTS 6,891,237 B1 *  5/2005  Bao .............. H01L 51/0516
                                                          257/411
7,858,151 B2 * 12/2010  Sager .............. H01L 31/0392
                                                          427/255.28

(Continued)

FOREIGN PATENT DOCUMENTS

CN    102618843    8/2012

OTHER PUBLICATIONS

Aikawa et al., "Si-incorporated amorphous indium oxide thin-film transistors", Japanese Journal of Applied Physics 58, (2019), pp. 090506-1-090506-15.

(Continued)

*Primary Examiner* — Dale E Page
*Assistant Examiner* — Quovaunda Jefferson
(74) *Attorney, Agent, or Firm* — Banner & Witcoff, Ltd.

(57) ABSTRACT

Methods of forming indium gallium zinc oxide (IGZO) films by vapor deposition are provided. The IGZO films may, for example, serve as a channel layer in a transistor device. In some embodiments atomic layer deposition processes for depositing IGZO films comprise an IGZO deposition cycle comprising alternately and sequentially contacting a substrate in a reaction space with a vapor phase indium precursor, a vapor phase gallium precursor, a vapor phase zinc precursor and an oxygen reactant. In some embodiments the ALD deposition cycle additionally comprises contacting the substrate with an additional reactant comprising one or more of $NH_3$, $N_2O$, $NO_2$ and $H_2O_2$.

24 Claims, 1 Drawing Sheet

(58) Field of Classification Search
CPC ......... H01L 21/02581; C23C 16/45531; C23C 16/40; C23C 16/45553
See application file for complete search history.

(56) References Cited

U.S. PATENT DOCUMENTS 9,171,960 B2 * 10/2015 Hong .............. H01L 21/823807
9,206,958 B2 * 12/2015 Kundaliya ................ F21V 9/08
9,685,542 B2 *  6/2017 Nomura .............. H01L 21/0262

OTHER PUBLICATIONS

Sheng et al., "Review Article: Atomic layer deposition for oxide semiconductor thin film transistors: Advances in research and development", J. Vac. Sci. Technol. A 36(6), Nov./Dec. 2018, pp. 060801-1-060801-13.

Yanguas-Gil et al., "Controlled Dopant Distribution and Higher Doping Efficiencies by Surface-Functionalized Atomic Layer Deposition", Chem. Mater. 2011, 23, pp. 4295-4297.

Yanguas-Gil et al., "Modulation of the Growth Per Cycle in Atomic Layer Deposition Using Reversible Surface Functionalization", Chem. Mater. 2013, 25, pp. 4849-4860.

Zan et al., "Achieving High Field-Effect Mobility in Amorphous Indium-Gallium Zinc Oxide by Capping a Strong Reduction Layer", Adv. Mater. 2012, 24, pp. 3509-3514.

* cited by examiner

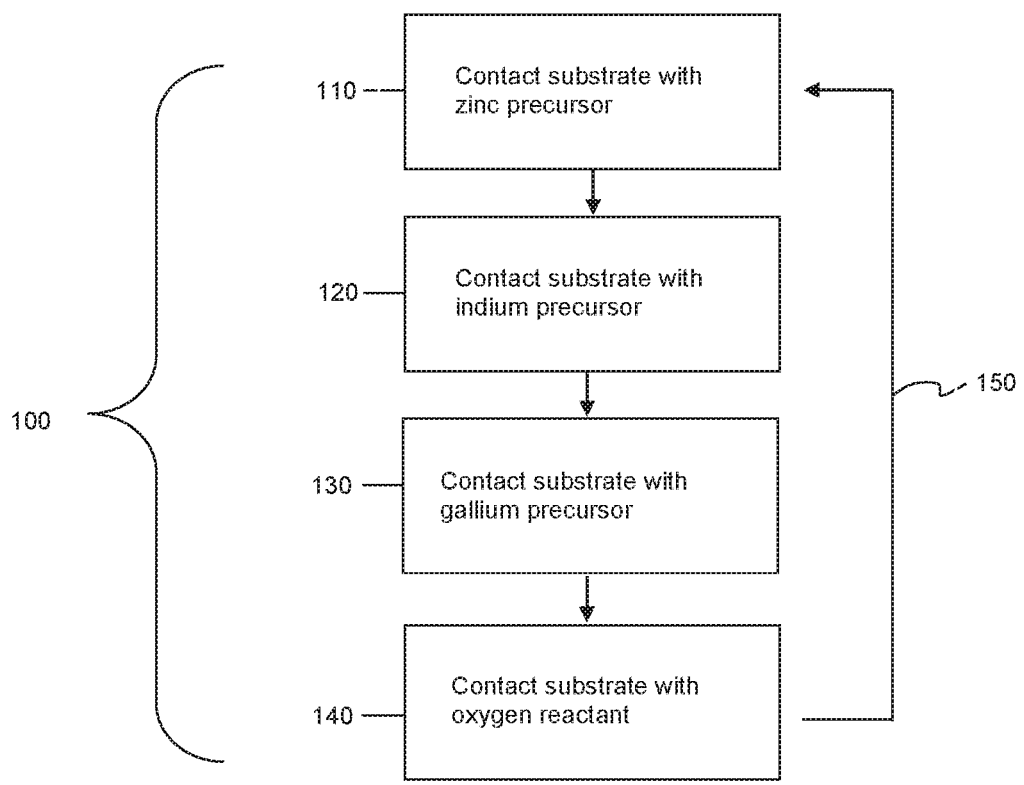

ATOMIC LAYER DEPOSITION OF INDIUM GALLIUM ZINC OXIDE

REFERENCE TO RELATED APPLICATION

This application claims priority to U.S. Provisional Application No. 62/916,476, filed Oct. 17, 2019, which is incorporated by reference herein.

BACKGROUND OF THE INVENTION

Field of the Invention

The application relates to vapor deposition processes for forming indium gallium zinc oxide (IGZO) films. In some aspects the IGZO films are used in memory applications.

Background

Currently, the most widely used techniques for the deposition of IGZO are sputtering and PE(CVD) processes. There is a need for processes which enable depositing IGZO films having a high mobility. There is an additional need for IGZO-containing transistors having a steep subthreshold slope and low leakage. There is an additional need for IGZO films which are stable with respect to thermal post-deposition treatments, such as a forming gas anneal.

BRIEF DESCRIPTION OF THE DRAWINGS

FIG. 1 is a flow chart illustrating an indium gallium zinc oxide (IGZO) deposition cycle according to some embodiments.

SUMMARY

In some aspects, methods of forming indium gallium zinc oxide (IGZO) films by vapor deposition are provided. The IGZO may, for example, serve as a channel layer in a transistor device. In some embodiments atomic layer deposition processes for depositing IGZO films comprise an IGZO deposition cycle comprising alternately and sequentially contacting a substrate in a reaction space with a vapor phase indium precursor, a vapor phase gallium precursor, a vapor phase zinc precursor and an oxygen reactant. The deposition cycle may be repeated until a IGZO film of a desired thickness has been formed. In some embodiments the IGZO film serves as a channel layer in a transistor device. In some embodiments, the deposition cycle is conducted at a deposition temperature of 250° C. or less.

In some embodiments the ALD deposition cycle additionally comprises contacting the substrate with an additional reactant comprising one or more of $NH_3$, $N_2O$, $NO_2$ and $H_2O_2$. In some embodiments the substrate is contacted simultaneously with the oxygen reactant and the additional reactant.

In some embodiments, the oxygen reactant comprises one or more of water, ozone and $H_2O_2$. In some embodiments the gallium precursor comprises at least one amine or alkylamine ligand. In some embodiments the zinc precursor comprises one or more of elemental zinc, a zinc halide, and an alkyl zinc compound. In some embodiments the indium precursor comprises one or more of an indium alkyl compound, an indium beta diketonate, an indium cyclopentadienyl and an indium halide.

In some embodiments, the indium precursor is trimethyl indium, the zinc precursor is diethyl zinc and the gallium precursor is $Ga(NMe_2)_3$.

In some embodiments, in the deposition cycle the substrate is contacted with the oxygen reactant after being contacted with the indium, zinc and gallium precursors.

In some embodiments, the IGZO deposition cycle comprises an indium zinc oxide (IZO) sub-cycle and a gallium zinc oxide (GZO) sub-cycle, and wherein the IGZO film comprises a mixture of indium zinc oxide and gallium zinc oxide. The deposition cycle may be repeated N1 times, with the IZO sub-cycle repeated N2 times within the deposition cycle and the GZO sub-cycle repeated N3 times within the deposition cycle, where N is an integer.

In some embodiments the IGZO deposition cycle comprises an indium zinc oxide (IZO) sub-cycle and an indium gallium zinc oxide (IGZO) sub-cycle. In some embodiments, the deposition cycle is repeated N1 times and the indium zinc oxide (IZO) sub-cycle is repeated N2 times within the deposition cycle and the indium gallium zinc oxide (IGZO) sub-cycle is repeated N3 times within the deposition cycle, where N is an integer.

In some embodiments, the deposition cycle comprises a zinc oxide sub-cycle that is repeated N1 times, the zinc oxide sub-cycle comprising alternately and sequentially contacting the substrate with the zinc precursor and the oxygen reactant, an indium oxide sub-cycle that is repeated N2 times, the indium oxide sub-cycle comprising alternately and sequentially contacting the substrate with the indium precursor and the oxygen reactant and a gallium oxide sub-cycle that is repeated N3 times, the gallium oxide sub-cycle comprising alternately and sequentially contacting the substrate with the gallium precursor and the oxygen reactant, wherein N is an integer; and wherein the indium precursor is trimethyl indium, the zinc precursor is diethyl zinc and the gallium precursor is $Ga(NMe_2)_3$.

In some embodiments, the deposition cycle comprises a zinc indium oxide sub-cycle that is repeated N1 times and comprises alternately and sequentially contacting the substrate with the zinc precursor, the indium precursor and the oxygen reactant and a gallium oxide sub-cycle that is repeated N2 times and comprises alternately and sequentially contacting the substrate with the gallium precursor and the oxygen reactant, where N is an integer.

In some embodiments, the deposition cycle comprises a zinc gallium oxide sub-cycle that is repeated N1 times and comprises alternately and sequentially contacting the substrate with the zinc precursor, the gallium precursor and the oxygen reactant; and an indium oxide sub-cycle that is repeated N2 times and comprises alternately and sequentially contacting the substrate with the indium precursor and the oxygen reactant, where N is an integer.

In some embodiments, the deposition cycle comprises a zinc oxide sub-cycle that is repeated N1 times and comprises alternately and sequentially contacting the substrate with the zinc precursor and the oxygen reactant; and an indium gallium oxide sub-cycle that is repeated N2 times and comprises alternately and sequentially contacting the substrate with the indium precursor and the gallium precursor and the oxygen reactant, where N is an integer.

In some embodiments, the substrate is contacted with a surface modification agent before the substrate is contacted with the vapor phase indium precursor, before the substrate is contacted with the vapor phase gallium precursor, and/or before the substrate is contacted with the vapor phase zinc precursor. The surface of the substrate may comprise active surface states, and in some embodiments contacting the substrate with a surface modification agent before the substrate is contacted with the vapor phase indium precursor, before the substrate is contacted with the vapor phase gallium precursor, and/or before the substrate is contacted with the vapor phase zinc precursor, may deactivate the active surface states to form deactivated surface states. Subsequently, remaining active surface states react with the vapor phase indium precursor, the vapor phase gallium precursor, and/or the vapor phase zinc precursor; and, whereas the deactivated surface states do not substantially react with the vapor phase indium precursor, the vapor phase gallium precursor, and/or the vapor phase zinc precursor.

In some embodiments the surface modification agent reacts with OH groups on the substrate surface. In some embodiments the surface modification agent may comprise an alcohol or acid anhydride.

In some embodiments the substrate is contacted with a dopant precursor. In some embodiments the substrate is contacted with a dopant precursor in one or more deposition cycles. The dopant precursor may comprise, for example, a cerium precursor, a tantalum precursor, a silicon precursor and/or a germanium precursor.

In some embodiments an ALD process for forming an IGZO thin film on a substrate comprises conducting a deposition cycle comprising alternately and sequentially contacting the substrate with a vapor phase indium precursor, a vapor phase gallium precursor, a vapor phase zinc precursor. The deposition cycle additionally comprises contacting the substrate with a first oxygen reactant and a second reactant. The deposition cycle may be repeated two or more times until an IGZO film of a desired thickness has been formed. In some embodiments the second reactant comprises one or more of $NH_3$, $N_2O$, $NO_2$ and $H_2O_2$.

In some embodiments the substrate is contacted with the oxygen reactant after being contacted with at least one of the indium, gallium and zinc reactants. In some embodiments the substrate is contacted with the oxygen reactant after being contacted with each of the indium, gallium and zinc reactants. In some embodiments the substrate is contacted with the oxygen reactant and the second reactant simultaneously.

In some embodiments, a deposition cycle comprises alternately and sequentially contacting the substrate with a vapor phase indium precursor, a vapor phase gallium precursor, a vapor phase zinc precursor, the first oxygen reactant and the second reactant.

DETAILED DESCRIPTION

In one aspect, methods of depositing indium gallium zinc oxide (IGZO) thin films by vapor deposition processes, such as atomic layer deposition, are provided. In some embodiments IGZO thin films may be formed on a substrate by vapor deposition processes comprising alternately and sequentially exposing a substrate to a vapor phase indium precursor, a vapor phase gallium precursor, a vapor phase zinc precursor, and one or more oxygen reactants.

As discussed below, in some embodiments a deposition cycle comprises one or more sub-cycles in which an oxide is deposited. For example, in some embodiments binary oxides of each separate precursor can be deposited in three deposition sub-cycles. In some embodiments a deposition cycle comprises a first sub-cycle in which indium oxide is deposited from a vapor-phase indium precursor, a second sub-cycle in which gallium oxide is deposited from a vapor-phase gallium precursor and a third sub-cycle in which zinc oxide is deposited by from a vapor-phase zinc precursor. In some embodiments in a sub-cycle the substrate is alternately and sequentially exposed to the indium, gallium or zinc vapor-phase precursor and an oxygen reactant.

In other embodiments, two or more precursors are provided prior to the oxygen reactant in a single sub-cycle. For example, in some embodiments indium zinc oxide (IZO) is deposited in one sub-cycle by alternately and sequentially exposing the substrate to an indium precursor, a zinc precursor and an oxygen reactant, and gallium zinc oxide is deposited in a second sub-cycle by alternately and sequentially exposing the substrate to a gallium precursor, a zinc precursor and an oxygen reactant.

In some embodiments a single deposition cycle comprises exposing a substrate to each of a gallium precursor, a zinc precursor and an indium precursor and exposing the substrate to an oxygen reactant after exposure to the three precursors, where the three precursors can be provided in any order.

In some embodiments an additional reactant gas, such as a gas comprising $NH_3$, $N_2O$, $NO_2$, and/or $H_2O_2$ may be provided in one or more deposition cycles to improve film properties.

In some embodiments the IGZO film may comprise a mixture of one or more individual oxides, such as indium zinc oxide (IZO) and gallium zinc oxide (GZO). The various oxides can be used to tune the IGZO film to achieve a desired result. For example, the amount of each of indium, gallium and zinc in the film can be tuned.

In some embodiments a post-deposition anneal and/or a post deposition treatment may be carried out, for example to improve the electrical properties of the film. A post-deposition anneal may comprise, for example, annealing in an oxygen environment. The disclosed methods can enable high conformality and full stoichiometry control of IGZO thin films, for example on high aspect ratio 3D structures, as needed for some memory applications.

In some embodiments, the indium gallium zinc oxide deposited by the disclosed methods can be used as the channel material in a transistor. This can allow for extremely low off currents and higher carrier mobility as compared to silicon. In some embodiments IGZO is deposited at low temperatures (<200° C.) allowing its use in back end of line (BEOL) devices. In some embodiments the IGZO film serves as a channel region in a BEOL logic device. In some embodiments the IGZO thin films can be deposited on three-dimensional structures with high conformality and high uniformity. This can allow for the use of the IGZO films in high aspect ratio devices such as DRAM. In some embodiments the IGZO film serves as a DRAM access transistor channel. In some embodiments the IGZO film serves as a VNAND (vertical NAND) channel.

Other contexts in which IGZO thin films may be utilized will be apparent to the skilled artisan. In some embodiments the IGZO thin films are not used as a transparent film transistor (TFT) for use in a display.

As noted above, vapor deposition processes are provided for depositing IGZO layers. In some embodiments, atomic layer deposition (ALD) techniques are to deposit conformal IGZO layers. Among vapor deposition techniques, ALD has the advantage of providing high conformality at low temperatures. In some embodiments cyclic CVD process may be utilized. Thus, in some embodiments reaction temperatures may be above the decomposition temperature of at least one precursor. In cyclic CVD reactions at least partial mixing of one or more precursors and reactants may take place. For example, the ALD processes described below could be modified to provide the precursors and reactants simultaneously or in at least partially overlapping pulses in each sub-cycle.

ALD-type processes are based on controlled, surface reactions of precursor chemicals. The surface reactions may or may not be self-limiting. Gas phase reactions may be avoided by feeding the precursors alternately and sequentially into the reaction chamber. Vapor phase reactants are typically separated from each other in the reaction chamber, for example, by removing excess reactants and/or reactant by-products from the reaction chamber between reactant pulses, a process which may be referred to as purging.

Briefly, a substrate is loaded into a reaction chamber and is heated to a suitable deposition temperature, generally at lowered pressure. The substrate may be, for example, a semiconductor substrate. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

In some embodiments the deposition temperature is from about 20° C. to about 600° C., from about to 100° C. to about 400° C., or from about 150° C. to about 300° C. In some embodiments the deposition temperature is about 225° C. or less. In some embodiments the deposition temperature is from about 150° C. to about 250° C. In some embodiments the deposition temperature is 225° C.

Each of the zinc, indium and gallium precursors is individually conducted into the chamber in the form of vapor phase pulse and contacted with the surface of a substrate. In some embodiments the substrate surface comprises a three-dimensional structure. In some embodiments, conditions are selected such that no more than about one monolayer of each precursor is adsorbed on the substrate surface in a self-limiting manner.

One or more gaseous oxygen reactants are pulsed into the chamber where they react with the zinc, indium and/or gallium species on the surface to form a respective oxide.

Excess precursor or reactant and reaction byproducts, if any, may be removed from the substrate and substrate surface and from proximity to the substrate and substrate surface between pulses of each precursor or reactant. In some embodiments, reactant and reaction byproducts, if any, may be removed by purging. Purging may be accomplished for example, with a pulse of inert gas such as nitrogen or argon.

Purging the reaction chamber means that vapor phase precursors or reactants and/or vapor phase byproducts are removed from the reaction chamber such as by evacuating the chamber with a vacuum pump and/or by replacing the gas inside the reactor with an inert gas such as argon or nitrogen. Typical purging times are from about 0.05 seconds to about 20 seconds, between about 1 second and about 10 seconds, or between about 1 second and about 2 seconds. However, other purge times can be utilized if necessary, such as when depositing layers over extremely high aspect ratio structures or other structures with complex surface morphology. The appropriate pulsing times can be readily determined by the skilled artisan based on the particular circumstances.

In other embodiments excess precursors (or reactants and/or reaction byproducts, etc.) are removed from the substrate surface or from the area of the substrate by physically moving the substrate from a location containing the precursor, reactant and/or reaction byproducts.

The steps of contacting the substrate with each precursor and reactant, such as by pulsing, and removing excess precursor or reactant and reaction byproducts, are repeated until a thin IGZO film of the desired thickness has been formed on the substrate, with each complete cycle typically leaving no more than about a molecular monolayer.

As mentioned above, each pulse or phase of each cycle may be self-limiting. An excess of reactant precursors can be supplied in each phase to saturate susceptible structure surfaces. Surface saturation ensures reactant occupation of substantially all, or a majority of, available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. As mentioned above, in some embodiments pulsed CVD processes are used.

In some embodiments, a reaction space can be in a single-wafer ALD reactor or a batch ALD reactor where deposition on multiple substrates takes place at the same time. In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

In addition to these ALD reactors, many other kinds of reactors capable of ALD growth of thin films, including CVD reactors equipped with appropriate equipment and means for pulsing the precursors can be employed. In some embodiments a flow type ALD reactor is used. Reactants are typically kept separate until reaching the reaction chamber, such that shared lines for the precursors are minimized. However, other arrangements are possible.

Suitable batch reactors include, but are not limited to, reactors designed specifically to enhance ALD processes. In some embodiments a vertical batch reactor is utilized in which the boat rotates during processing. Thus, in some embodiments the wafers rotate during processing. In some embodiments in which a batch reactor is used, wafer-to-wafer uniformity is less than 3% (1 sigma), less than 2%, less than 1% or even less than 0.5%.

The IGZO deposition processes described herein can optionally be carried out in a reactor or reaction space connected to a cluster tool. In a cluster tool, because each reaction space is dedicated to one type of process, the temperature of the reaction space in each module can be kept constant, which can improve the throughput compared to a reactor in which the substrate is heated up to the process temperature before each run.

As illustrated in FIG. 1, in some embodiments, IGZO thin films are deposited by a deposition cycle 100 comprising alternately and sequentially contacting a substrate with a zinc precursor 110, an indium precursor 120, a gallium precursor 130 and an oxygen-containing reactant 140. The deposition cycle is repeated 150 to deposit a film of the desired thickness.

In some embodiments at least one of the zinc precursor, indium precursor and gallium precursor are provided prior to the oxygen reactant. In some embodiments each of the zinc precursor, indium precursor and gallium precursor are provided prior to the oxygen reactant. The zinc, indium and gallium precursors may be provided in any order. In some embodiments the precursors are provided sequentially in a deposition cycle in which the substrate is alternately contacted with the zinc precursor, the indium precursor, the gallium precursor and the oxygen reactant, in that order. The deposition cycle is repeated to deposit an IGZO film of the desired thickness. The deposition cycle may be written as [zinc precursor+indium precursor+gallium precursor+oxygen reactant]×N1, where N1 is an integer and the brackets indicate one ALD cycle. In some embodiments DEZ is used as a zinc precursor, TMIn is used as an indium precursor and an alkylamino gallium precursor such as TDMAGa is used as a gallium precursor and the deposition cycle may be written as [DEZ+TMIn+alkylamino gallium+oxygen reactant]×N1, where N1 is an integer and the brackets indicate one ALD cycle.

In some embodiments the oxygen reactant may be provided after one or more of the zinc, indium and gallium precursors. For example, in some embodiments an IGZO deposition super-cycle comprises three sub-cycles, each of which forms a respective oxide. In a first zinc oxide sub-cycle the substrate is alternately and sequentially contacted with the zinc precursor and an oxygen reactant. The first sub-cycle may be repeated one, two, or more times. In a second indium oxide sub-cycle the substrate is alternately and sequentially contacted with an indium precursor and an oxygen reactant. The second sub-cycle may be repeated one, two or more times. In a third gallium oxide sub-cycle the substrate is alternately and sequentially contacted with a gallium precursor and an oxygen reactant. The third sub-cycle may be repeated one, two or more times. The oxygen reactant may be the same in each sub-cycle or may differ in one or more sub-cycles. Although referred to as the first, second and third sub-cycles, the sub-cycles may be carried out in any order in the super-cycle. In addition, the number of times that each sub-cycle is carried out may be independently varied in the super-cycle. For example, the number of times that one or more of the sub-cycles is carried out may be varied to achieve a desired composition. The number of times that each sub-cycle is carried out may be the same in each super-cycle or may vary. The super-cycle may be repeated one, two or more times to achieve a IGZO film of the desired thickness and composition.

The deposition super cycle comprising the three sub-cycles may be written as {[zinc precursor+oxygen reactant]×N1+[indium precursor+oxygen reactant]×N2+[gallium precursor+oxygen reactant]×N3}×N4, where N is an integer and the brackets represent one ALD sub-cycle. In some embodiments an anneal in an oxygen environment is included in the super cycle, and the deposition super cycle comprising the three sub-cycles may be written as {[zinc precursor+oxygen reactant]×N1+[indium precursor+oxygen reactant]×N2+[gallium precursor+oxygen reactant]×N3+[oxygen reactant anneal]×N4}×N5, where N is an integer and the brackets represent one ALD sub-cycle. Such an oxygen reactant anneal step may be included in any of the deposition cycles described herein.

In some embodiments DEZ is used as a zinc precursor, TMIn is used as an indium precursor and an alkylamino gallium precursor, such as TDMAGa, is used as a gallium precursor and the deposition super cycle comprising the three sub-cycles may be written as {[DEZ+oxygen reactant]×N1+[TMIn+oxygen reactant]×N2+[alkylamino gallium+oxygen reactant]×N3+[oxygen reactant anneal]×N4}×N5, where N1, N2, N3, N4, and N5 are integers and the brackets represent one ALD sub-cycle.

In some embodiments one or more of the sub-cycles may be repeated multiple times relative to one or more other sub-cycles. For example, in some embodiments the indium oxide sub-cycle and the zinc oxide sub-cycle may be repeated a certain number of times relative to the gallium oxide sub-cycle. Such a super-cycle may be written as {[(zinc precursor+oxygen reactant)×N1+(indium precursor+oxygen reactant)×N2]×N3+[gallium precursor+oxygen reactant]×N4}×N5, where N1, N2, N3, N4, and N5 are integers and the brackets represent one ALD sub-cycle. In some embodiments a zinc alkyl such as diethyl zinc (DEZ) is used as a zinc precursor, an indium alkyl such as trimethyl indium (TMIn) is used as an indium precursor and a gallium alkylamide, such as Tris(dimethylamido) gallium(III) (TDMAGa), is used as a gallium precursor.

In some embodiments an IGZO deposition super-cycle comprises a first zinc indium oxide sub-cycle in which the substrate is alternately and sequentially contacted with a zinc precursor, an indium precursor and an oxygen reactant. The precursors may be provided in any order. The first sub-cycle may be repeated one, two or more times. In a second gallium oxide sub-cycle the substrate is alternately and sequentially contacted with a gallium precursor and an oxygen reactant. The second sub-cycle may be repeated one, two or more times. The oxygen reactant may be the same in each sub-cycle or may differ in one or more sub-cycles. Although referred to as the first and second sub-cycles, the sub-cycles may be carried out in any order in the super-cycle. In addition, the number of times that each sub-cycle is carried out may be independently varied in the super-cycle. For example, the number of times that one or more of the sub-cycles is carried out may be varied to achieve a desired composition. The number of times that each sub-cycle is carried out may be the same in each super-cycle or may vary. The super-cycle may be repeated one, two or more times to achieve a IGZO film of the desired thickness and composition. The super-cycle comprising the two sub-cycles may be written as {[zinc precursor+indium precursor+oxygen reactant]×N1+[gallium precursor+oxygen reactant]×N2}×N3, where N1, N2, and N3 are integers and the brackets represent one ALD sub-cycle. In some embodiments DEZ is used as a zinc precursor, TMIn is used as an indium precursor and an alkylamino gallium precursor such as TDMAGa is used as a gallium precursor and the deposition super cycle comprising the two sub-cycles may be written as {[DEZ+TMIn+oxygen reactant]×N1+[alkylamino gallium+oxygen reactant]×N2}×N3, where N1, N2, and N3 are integers and the brackets represent one ALD sub-cycle.

In some embodiments, an IGZO deposition super-cycle comprises two sub-cycles in which in a first zinc gallium oxide sub-cycle the substrate is alternately and sequentially contacted with a zinc precursor, a gallium precursor and an oxygen reactant. The precursors may be provided in any order. The first sub-cycle may be repeated one, two or more times. In a second indium oxide sub-cycle, the substrate is alternately and sequentially contacted with an indium precursor and an oxygen reactant. The second sub-cycle may be repeated one, two or more times. The oxygen reactant may be the same in each sub-cycle or may differ in one or more sub-cycles. Although referred to as the first and second sub-cycles, the sub-cycles may be carried out in any order in the super-cycle. In addition, the number of times that each sub-cycle is carried out may be independently varied in the super-cycle. For example, the number of times that one or more of the sub-cycles is carried out may be varied to achieve a desired composition. The number of times that each sub-cycle is carried out may be the same in each super-cycle or may vary. The super-cycle may be repeated one, two or more times to achieve a IGZO film of the desired thickness and composition. The super-cycle comprising the two sub-cycles may be written as {[zinc precursor+gallium precursor+oxygen reactant]×N1+[indium precursor+oxygen reactant]×N2}×N3, where N is an integer and the brackets represent one ALD sub-cycle. In some embodiments DEZ is used as a zinc precursor, TMIn is used as an indium precursor and an alkylamino gallium precursor such as TDMAGa is used as a gallium precursor and the deposition super cycle comprising the two sub-cycles may be written as {[DEZ+alkylamino gallium+oxygen reactant]×N1+[TMIn+ oxygen reactant]×N2}×N3, where N1, N2, and N3 are integers and the brackets represent one ALD sub-cycle.

In some embodiments an IGZO deposition super-cycle comprises two sub-cycles in which in a first zinc oxide sub-cycle the substrate is alternately and sequentially contacted with the zinc precursor and an oxygen reactant. The first sub-cycle may be repeated one, two or more times. In a second indium gallium oxide sub-cycle the substrate is alternately and sequentially contacted with an indium precursor, a gallium precursor and an oxygen reactant. The two precursors may be provided in any order. The second sub-cycle may be repeated one, two or more times. The oxygen reactant may be the same in each sub-cycle or may differ in one or more sub-cycles. Although referred to as the first and second sub-cycles, the sub-cycles may be carried out in any order in the super-cycle. In addition, the number of times that each sub-cycle is carried out may be independently varied in the super-cycle. For example, the number of times that one or more of the sub-cycles is carried out may be varied to achieve a desired composition. The number of times that each sub-cycle is carried out may be the same in each super-cycle or may vary. The super-cycle may be repeated one, two or more times to achieve a IGZO film of the desired thickness and composition. The super-cycle comprising the two sub-cycles may be written as {[zinc precursor+oxygen reactant]×N1+[indium precursor+gallium precursor+oxygen reactant]×N2}×N3, where N1, N2, and N3 are integers and the brackets represent one ALD sub-cycle. In some embodiments DEZ is used as a zinc precursor, TMIn is used as an indium precursor and an alkylamino gallium precursor such as TDMAGa is used as a gallium precursor and the deposition super cycle comprising the two sub-cycles may be written as {[DEZ+oxygen reactant]×N1+[TMIn+alkylamino gallium+oxygen reactant]×N2}×N3, where N1, N2, and N3 are integers, and the brackets represent one ALD sub-cycle.

In some embodiments a deposition super-cycle for producing an IGZO film comprises one or more indium zinc oxide (IZO) sub-cycles and one or more gallium zinc oxide (GZO) sub-cycles. In the IZO sub-cycle the substrate is alternately and sequentially contacted with an indium precursor, a zinc precursor and an oxygen reactant. The indium and zinc precursors may be provided in any order. The IZO sub-cycle may be repeated one, two or more times. In the GZO sub-cycle the substrate is alternately and sequentially contacted with a gallium precursor, a zinc precursor and an oxygen reactant. The gallium and zinc precursors may be provided in any order. The GZO sub-cycle may be repeated one, two or more times. The oxygen reactant may be the same in each sub-cycle or may differ in one or more sub-cycles. The IZO and GZO sub-cycles may be carried out in any order in the super-cycle. In addition, the number of times that each sub-cycle is carried out may be independently varied in the super-cycle, for example to achieve a desired stoichiometry. For example, the number of times that the GZO sub-cycle is carried relative to the IZO sub-cycle may be selected to achieve a desired In/Ga ratio in the IGZO film. The super-cycle may be repeated one, two or more times to achieve a IGZO film of the desired thickness and composition. The super-cycle comprising the two oxide sub-cycles may be written as {[indium precursor+zinc precursor+oxygen reactant]×N1+[gallium precursor+zinc precursor+oxygen reactant]×N2}×N3, where N1, N2, and N3 are integers, and the brackets represent one ALD sub-cycle. In some embodiments DEZ is used as a zinc precursor, TMIn is used as an indium precursor and an alkylamino gallium precursor such as TDMAGa is used as a gallium precursor and the deposition super cycle comprising the two sub-cycles may be written as {[TMIn+DEZ+oxygen reactant]×N1+[alkylamino gallium+DEZ+oxygen reactant]× N2}×N3, where N1, N2, and N3 are integers, and the brackets represent one ALD sub-cycle.

In some embodiments a deposition super-cycle for producing a film with the desired properties comprises one or more indium zinc oxide (IZO) sub-cycles and one or more indium gallium zinc oxide (IGZO) sub-cycles. The IZO sub-cycles and the IGZO sub-cycles may be repeated at a selected ratio to produce a film with the desired properties. In the IZO sub-cycle the substrate is, for example, alternately and sequentially contacted with an indium precursor, a zinc precursor and an oxygen reactant. The indium and zinc precursors may be provided in any order, and an oxygen reactant may be provided after one or both precursors. The IZO sub-cycle may be repeated one, two or more times. The IGZO may be formed by any of the deposition cycles described herein. In the IGZO sub-cycle the substrate is alternately and sequentially contacted with an indium precursor, a gallium precursor, a zinc precursor and an oxygen reactant, as described herein. The indium, gallium and zinc precursors may be provided in any order, and an oxygen reactant may be provided after one or more of each of the precursors. The IGZO sub-cycle may be repeated one, two or more times and, as mentioned above is conducted at a desired ratio with the IZO sub-cycle. The oxygen reactant may be the same in each sub-cycle or may differ in one or more sub-cycles. The IZO and IGZO sub-cycles may be carried out in any order in the super-cycle. In addition, the number of times that each sub-cycle is carried out may be independently varied in the super-cycle, for example to achieve a desired stoichiometry. For example, the number of times that the IGZO sub-cycle is carried relative to the IZO sub-cycle may be selected to achieve a desired film. The super-cycle may be repeated one, two or more times to achieve a film of the desired thickness and composition. The super-cycle comprising the two sub-cycles may be written as {[IZO]×N1+[IGZO]×N2}×N3, where N is an integer, and the brackets represent one ALD sub-cycle. In some embodiments DEZ is used as a zinc precursor, TMIn is used as an indium precursor and an alkylamino gallium precursor such as TDMAGa is used as a gallium precursor. In some embodiments a bilayer is formed comprising an IZO layer and an IGZO layer.

As mentioned above, in some embodiments the IGZO film may comprise a mixture of one or more individual oxides, such as indium zinc oxide (IZO) and gallium zinc oxide (GZO) or IZO and IGZO. In some embodiments the stoichiometry of an IGZO film may be tuned by adjusting the ration of individual oxides in the film. In some embodiments a desired stoichiometry of an IGZO film is achieved by selecting the numbers of each sub-cycle within a super-cycle, for example to provide a desired In/Ga ratio. In some embodiments one or more indium zinc oxide (IZO) and/or gallium zinc oxide (GZO) sub-cycles may be included in a deposition process to arrive at a desired indium and gallium content in a film, such as a desired In/Ga ratio.

In some embodiments an additional reactant is included in one or more super-cycles. The additional reactant may, for example, improve the desired electrical properties of the IGZO film. In some embodiments the additional reactant may be used to control the carrier density or concentration. In some embodiments the additional reactant may be used to control defect formation during growth of IGZO layers. In some embodiments the additional reactant may passivate oxygen vacancies in the growing IGZO film. In some embodiments the additional reactant may comprise one or more of $NH_3$, $N_2O$, $NO_2$ and $H_2O_2$.

In some embodiments the additional reactant is included in one, two or more sub-cycles in a super-cycle. In some embodiments the additional reactant is included in each sub-cycle in at least one super-cycle. In some embodiments the additional reactant is provided separately in at least one super-cycle, for example after completing one sub-cycle and before beginning the next.

In each of the sub-cycles described above, the additional reactant may be provided with or after the oxygen reactant. In some embodiments, the additional reactant may be provided alternately and sequentially after the oxygen reactant. For example, a sub-cycle including the additional reactant may be written as [metal precursor (zinc, indium or gallium)+oxygen reactant+additional reactant]×N1, where N is an integer. In some embodiments, the additional reactant may be provided with the oxygen reactant, as in the sequence: [metal precursor (zinc, indium or gallium)+(oxygen reactant+additional reactant)]×N1, where N1 is an integer. That is, in some embodiments the additional reactant is provided simultaneously with the oxygen reactant. In some embodiments the additional reactant may be flowed constantly throughout a deposition sub-cycle, or even throughout a deposition super-cycle.

In some embodiments the additional reactant is provided in one or more binary oxide sub-cycles. In some embodiments the additional reactant is provided in a zinc oxide sub-cycle. For example, a zinc oxide sub-cycle may be written as [zinc precursor+oxygen reactant+additional reactant]×N1, where N1 is an integer. In some embodiments the additional reactant is provided in an indium oxide sub-cycle. For example, an indium oxide sub-cycle may be written as [indium precursor+oxygen reactant+additional reactant]×N1, where N1 is an integer. In some embodiments the additional reactant is provided in a gallium oxide sub-cycle. For example, a gallium oxide sub-cycle may be written as [gallium precursor+oxygen reactant+additional reactant]×N1, where N1 is an integer. As mentioned above, in some embodiments the additional reactant may be provide simultaneously with the oxygen reactant.

In some embodiments the additional reactant may be provided in an IZO and/or GZO sub-cycle. Such an IZO sub-cycle may be given as, for example, [indium precursor+zinc precursor+oxygen reactant+additional reactant]×N where N is an integer. Such a GZO sub-cycle may be given as, for example, [gallium precursor+zinc precursor+oxygen reactant+additional reactant]×N where N is an integer. In some embodiments an IGZO super-cycle may comprise an IZO sub-cycle and a GZO sub-cycle that each use an additional reactant. This may be given as [indium precursor+zinc precursor+oxygen reactant+additional reactant]×N1+[gallium precursor+zinc precursor+oxygen reactant+additional reactant]×N2, where N is an integer. As discussed above, the additional reactant may be provided simultaneously with the oxygen reactant in some embodiments. In some embodiments the additional reactant may flow throughout one or both of the sub-cycles, or even throughout the super-cycle.

In some embodiments a dopant precursor is included in one or more super-cycles. The dopant precursor may, for example, improve the desired electrical properties of the IGZO film. In some embodiments the dopant precursor may be used to enhance the thermal stability of the IGZO channel layer, e.g. the thermal stability during a forming gas anneal. Thus, the IGZO channel layers described herein may comprise one or more dopants.

In some embodiments, the dopant concentration, for example in an IGZO channel layer, is from at least $10^{-15}$ atomic percent to at most 10 atomic percent, e.g. from at least $10^{-15}$ atomic percent to at most $10^{-14}$ atomic percent, e.g. from at least $10^{-15}$ atomic percent to at most $10^{-14}$ atomic percent, e.g. from at least $10^{-14}$ atomic percent to at most $10^{-13}$ atomic percent, e.g. from at least $10^{-13}$ atomic percent to at most $10^{-12}$ atomic percent, e.g. from at least $10^{-12}$ atomic percent to at most $10^{-11}$ atomic percent, e.g. from at least $10^{-11}$ atomic percent to at most $10^{-10}$ atomic percent, e.g. from at least $10^{-10}$ atomic percent to at most $10^{-9}$ atomic percent, e.g. from at least $10^{-9}$ atomic percent to at most $10^{-8}$ atomic percent, e.g. from at least $10^{-8}$ atomic percent to at most $10^{-7}$ atomic percent, e.g. from at least $10^{-7}$ atomic percent to at most $10^{-6}$ atomic percent, e.g. from at least $10^{-6}$ atomic percent to at most $10^{-5}$ atomic percent, e.g. from at least $10^{-5}$ atomic percent to at most $10^{-4}$ atomic percent, e.g. from at least $10^{-4}$ atomic percent to at most $10^{-3}$ atomic percent, e.g. from at least $10^{-3}$ atomic percent to at most $10^{-2}$ atomic percent, e.g. from at least $10^{-2}$ atomic percent to at most $10^{-1}$ atomic percent, e.g. from at least $10^{-1}$ atomic percent to at most 1 atomic percent, e.g. from at least 1 atomic percent to at most 10 atomic percent.

In some embodiments the dopant precursor is included in one, two or more sub-cycles in a super-cycle. In some embodiments the dopant precursor is included in each sub-cycle in at least one super-cycle. In some embodiments the dopant precursor is provided separately in at least one super-cycle, for example after completing one sub-cycle and before beginning the next.

In some embodiments, the dopant precursor can be provided in a separate pulse. Alternatively, the dopant precursor can be provided together with one or more of the other precursors. Optionally, dopant precursor pulses are separated from other pulses by means of purges.

In each of the sub-cycles described above, the dopant precursor may be provided with or after the indium precursor, the gallium precursor, and/or the zinc precursor. In some embodiments, the dopant precursor may be provided alternately and sequentially after the zinc precursor, the gallium precursor, and/or the indium precursor. For example, a sub-cycle including the dopant precursor may be written as [metal precursor (zinc, indium or gallium)+dopant precursor+oxygen reactant]×N1, where N1 is an integer. In some embodiments, the dopant precursor may be provided with the metal precursor, as in the sequence: [(metal precursor (zinc, indium or gallium)+dopant precursor)+(oxygen reactant)]×N1, where N1 is an integer. That is, in some embodiments the dopant precursor is provided simultaneously with the metal precursor. In some embodiments the dopant precursor may be flowed constantly throughout a deposition sub-cycle, or even throughout a deposition super-cycle.

In some embodiments, the dopant precursor may be flowed prior to a deposition super-cycle. In some embodiments, the dopant precursor may be flowed subsequent to a deposition super-cycle. In other words, in some embodiments the dopant precursor may be flowed before or after the IGZO layer has been deposited. In such embodiments, one or more monolayer or a sub-monolayer (i.e. part of a monolayer) of dopant atoms may be formed that can diffuse into the IGZO layer during subsequent thermal processes, e.g. during a forming gas anneal.

In some embodiments the dopant precursor is provided in one, two or more binary oxide sub-cycles. In some embodiments the dopant precursor is provided in a zinc oxide sub-cycle. For example, a zinc oxide sub-cycle may be written as [zinc precursor+dopant precursor+oxygen reactant]×N, where N is an integer. In some embodiments the dopant precursor is provided in an indium oxide sub-cycle. For example, an indium oxide sub-cycle may be written as [indium precursor+dopant precursor+oxygen reactant]×N, where N is an integer. In some embodiments the dopant precursor is provided in a gallium oxide sub-cycle. For example, a gallium oxide sub-cycle may be written as [gallium precursor+dopant precursor+oxygen reactant]×N, where N is an integer. As mentioned above, in some embodiments the dopant precursor may be provided simultaneously with the metal precursor.

In some embodiments the dopant precursor may be provided in an IZO and/or GZO sub-cycle. Such an IZO sub-cycle may be given as, for example, [indium precursor+zinc precursor+dopant precursor+oxygen reactant]×N where N is an integer. Such a GZO sub-cycle may be given as, for example, [gallium precursor+zinc precursor+dopant precursor+oxygen reactant]×N where N is an integer. In some embodiments an IGZO super-cycle may comprise an IZO sub-cycle and a GZO sub-cycle that each use a dopant precursor. This may be given as [indium precursor+zinc precursor+dopant precursor+oxygen reactant]×N1+[gallium precursor+zinc precursor+dopant precursor+oxygen reactant]×N2, where N, N1, and N2 are integers. As discussed above, the dopant precursor may be provided simultaneously with one or more of the metal reactants, in some embodiments. In some embodiments the dopant precursor may flown throughout one or both of the sub-cycles, or even throughout the super-cycle.

In some embodiments, the dopant precursor is provided in between two sub-cycles.

In some embodiments, the dopant precursor comprises a tantalum precursor. In some embodiments, the tantalum precursor comprises a tantalum beta-diketonate. In some embodiments, the tantalum precursor comprises a tantalum alkylamide. In some embodiments, the tantalum precursor comprises a cyclopentadienyl ligand. In some embodiments, the tantalum precursor comprises a tantalum alkylimide. In some embodiments, the tantalum precursor comprises both alkylamide and alkylimide ligands. In some embodiments, the tantalum precursor comprises a tantalum alkylidene. In some embodiment, the tantalum precursor comprises a tantalum halide. In some embodiments, the tantalum precursor comprises a precursor selected form the list consisting of tantalum(V) methoxide (Ta(OMe)$_5$), tantalum(V) isopropoxide (Ta(O$^i$Pr)$_5$), Tantalum(V) ethoxide (Ta(OEt)$_5$), Tris (ethylmethylamido)(tert-butylimido)tantalum(V) (Ta(N$^t$Bu) (NEtMe)$_3$), tris(diethylamido)(N-tert-butylimido)tantalum (Ta(N$^t$Bu)(NEt$_2$)$_3$), tris(dimethylamido)(tert-butylimido) tantalum(V) (Ta(N$^t$Bu)(NMe$_2$)$_3$), tantalum chloride (TaCl5), tantalum fluoride (TaF5), tantalum bromide (TaBr5), tantalum iodide (TaI5), Pentakis(dimethylamido)tantalum (Ta (NMe$_2$)$_5$), Pentakis(diethylamido)tantalum (Ta(NEt$_2$)$_5$), Pentakis(ethylmethylamido)tantalum (Ta(NEtMe)$_5$), Tris(3, 5-di-tert-butylpyrazolato)(tert-butylimido)tantalum (Ta (N$^t$Bu)($^t$Bu$_2$pz)$_3$), Bis(N,N'-diisopropylacetamidinato)(tert-butylimido)(dimethylamido)tantalum (Ta(N$^t$Bu)($^i$PrAMD)$_2$ (NMe$_2$)), and bis(diethylamido)cyclopentadienyl(tert-butylimido)tantalum (TaCp(N$^t$Bu)(NEt$_2$)$_2$), Suitable tantalum precursors comprising both alkylamide and alkylimide ligands include tris(diethylamido)(tert-butylimido)tantalum(V) (Ta(N$^t$Bu)(NEt$_2$)$_3$), tris(dimethylamido) (tert-butylimido)tantalum(V) (Ta(N$^t$Bu)(NMe$_2$)$_3$), tris (methylethylamido)(tert-butylimido)tantalum(V) (Ta(N$^t$Bu) (NEtMe)$_3$), tris(diethylamido)(ethylimido)tantalum(V) (Ta (NEt)(NEt$_2$)$_3$), tris(methylethylamido)(isopropylimido) tantalum(V) (Ta(N$^i$Pr)(NEtMe)$_3$), and Tantalum t-amylimide tris(dimethylamide) (Ta(N$^t$Am)(NMe$_2$)$_3$). Suitable tantalum alkoxides include tantalum(V) methoxide (Ta(OMe)$_5$), tantalum(V) ethoxide (Ta(OEt)$_5$), and tantalum (V) isopropoxide Ta(O$^i$Pr)$_5$.

In some embodiments, the dopant precursor comprises a cerium precursor. In some embodiments, the cerium precursor comprises a cerium beta-diketonate such as Cerium (III) acetylacetonate (Ce(acac)$_3$), Tris(2,2,6,6,-tetramethylheptane-3,5-dionato)cerium (Ce(thd)$_3$), Tris(1,1,1,5,5,5-hexafluoropentane-2,4-dionato)cerium (Ce(hfac)$_3$), In some embodiments, the cerium precursor comprises a cerium amidinate, e.g. a cerium amidinate such as tris(N,N'-diisopropylacetamidinato)cerium ((Ce($^i$Pr$_2$AMD)$_3$), tris(N,N'-di-tert-butylacetamidato)cerium (Ce(tBu$_2$AMD)$_3$), tris(N,N'-di-isopropylformamidato)cerium (Ce(iPr$_2$FMD)$_3$), tris(N,N'-di-tert-butylformamidato)cerium (Ce(tBu$_2$FMD)$_3$). In some embodiments, the cerium precursor comprises a precursor selected from the list consisting of (isopropylcyclopentadienyl)cerium (Ce($^i$PrCp)$_3$), (methylcyclopentadienyl) cerium (Ce(MeCp)$_3$), (ethylcyclopentadienyl)cerium (Ce (EtCp)$_3$), (tert-butylcyclopentadienyl)cerium (Ce($^t$BuCp)$_3$), bis(isopropylcyclopentadienyl)(N,N'-diisopropylacetamidinato)cerium (Ce($^i$PrCp)$_2$($^i$Pr$_2$AMD)), bis(isopropylcyclopentadienyl)(N,N'-di-tert-butylacetamidinato)cerium (Ce ($^i$PrCp)$_2$($^t$B$_2$uAMD)) bis(ethylcyclopentadienyl)(N,N'-diisopropylacetamidinato)cerium (Ce(EtCp)$_2$($^i$Pr$_2$AMD)), bis(ethylcyclopentadienyl)(N,N'-di-tert-butylacetamidinato) cerium (Ce(EtCp)$_2$($^t$Bu$_2$AMD)), bis(isopropylcyclopentadienyl)(N,N'-diisopropylformamidinato)cerium (Ce($^i$PrCp)$_2$ ($^i$Pr$_2$FMD)), bis(isopropylcyclopentadienyl)(N,N'-di-tert-butylformamidinato)cerium (Ce($^i$PrCp)$_2$($^t$Bu$_2$FMD)) bis (ethylcyclopentadienyl)(N,N'-diisopropylformamidinato) cerium (Ce(EtCp)$_2$($^i$Pr$_2$FMD)), bis(ethylcyclopentadienyl) (N,N'-di-tert-butylformamidinato)cerium (Ce(EtCp)$_2$ ($^t$Bu$_2$FMD)), Ce(mmp)$_4$ (mmp=OCMe$_2$CH$_2$OMe), Cerium tris(2,2,6,6-tetramethyl-3,5-heptanedionate) phenantroline adduct (Ce(thd)$_3$phen), and Cerium tetrakis(2,2,6,6-tetramethyl-3,5-heptanedionate) (Ce(thd)$_4$).

In some embodiments, the dopant precursor comprises a precursor mixture comprising a tantalum precursor and a cerium precursor.

Advantageously, in some embodiments doping IGZO films with cerium and/or tantalum produces IGZO films with improved thermal resistance, relative to undoped films. In addition, the addition of cerium and/or tantalum can allow advantageously influencing the electrical properties such as one or more of bandgap, carrier concentration, and mobility of IGZO films.

In some embodiments, the dopant comprises germanium, and the dopant precursor comprises a germanium precursor. Suitable germanium precursors comprise germanium alkylamines such as Tetrakis(dimethylamino)germanium (TDMAGe) and germanium alkoxides such as Germanium ethoxide (Ge(OEt)$_4$).

In some embodiments, the dopant comprises silicon, and the dopant precursor comprises a silicon precursor. Suitable silicon precursors comprise silicon alkylamines such as tris(dimethylamino) silane, tetrakis(dimethylamino)silane, tetrakis(ethylmethylamino)silane, bis(diethylamino)silane, and bis(tert-butylamino)silane. In some embodiments the suitable silicon precursor comprises a silicon carboxylate, for example a silicon carboxylate selected from the list consisting of silicon tetraacetate (triacetyloxysilyl acetate), triacetoxyvinylsilane, silicon tetrapropionate, triacetoxysilane, triacetoxy(methyl)silane, triacetoxy(methoxy)silane, and diacetoxydimethylsilane.

In some embodiments, a dopant pulse may be followed by an oxygen reactant pulse (with an optional purge in between) using an oxygen reactant that may or may not differ from the oxygen reactant or oxygen reactants used elsewhere during IGZO deposition. Exemplary oxygen reactants are listed elsewhere herein.

In some embodiments, a deposition super cycle comprises a dopant pulse using a silicon carboxylate as dopant precursor, followed by a pulse of a reactant selected from ammonia (NH$_3$), water, hydrogen peroxide, hydrazine (N$_2$H$_4$) or alkyl-substituted hydrazines such as methyl substituted hydrazines such as N,N dimethyl hydrazine or N,N' dimethyl hydrazine.

In some embodiments the reactant provided after a silicon carboxylate pulse comprises a silicon carboxylate co-reactant selected from the list consisting of of ammonia (NH$_3$), water, hydrogen peroxide, hydrazine (N$_2$H$_4$), and alkyl-substituted hydrazines such as methyl substituted hydrazines such as N,N dimethyl hydrazine and N,N' dimethyl hydrazine. In any of the sub-cycles described above, a silicon carboxylate may be provided with or after the indium precursor, the gallium precursor, and/or the zinc precursor. In some embodiments, the silicon carboxylate may be provided alternately and sequentially after the zinc precursor, the gallium precursor, and/or the indium precursor. For example, a sub-cycle including the silicon carboxylate may be written as [metal precursor (zinc, indium or gallium)+silicon carboxylate+silicon carboxylate co-reactant]×N1, where N1 is an integer. In some embodiments, the silicon carboxylate may be provided with the metal precursor, as in the sequence: [(metal precursor (zinc, indium or gallium)+silicon carboxylate precursor)+(silicon carboxylate co-reactant)]×N1, where N1 is an integer. That is, in some embodiments the silicon carboxylate is provided simultaneously with the metal precursor. In some embodiments the silicon carboxylate may be flowed constantly throughout a deposition sub-cycle, or even throughout a deposition super-cycle.

In some embodiments, an IGZO deposition super-cycle comprises a surface modification step in which the substrate is contacted with a surface modification agent. The surface modification may activate or deactivate surface states on the substrate, thus influencing the amount of precursor that chemisorbs on the substrate in a subsequent step of providing the precursor. The surface modification step may be carried out at any suitable moment in an IGZO deposition super-cycle. For example, the substrate may be contacted with a surface modification agent before the substrate is contacted with an indium precursor. Additionally or alternatively, the substrate may be contacted with a surface modification agent before the substrate is contacted with a gallium precursor. Additionally or alternatively, the substrate may be contacted with a surface modification agent before the substrate is contacted with a zinc precursor. Additionally or alternatively, the substrate may be contacted with a surface modification agent before the substrate is contacted with an oxygen reactant. This can advantageously reduce the growth per cycle of one or more film constituent subcycles in order to enable realization of a given composition with a minimum number of total subcycles in a master cycle. In other words, the use of a surface modification agent can improve intermixing and avoid or reduce compositional variability along the growth direction.

Thus, in some embodiments, a process as described herein employs a surface modification step in which the substrate is contacted with a surface modification agent before the substrate is contacted with the vapor phase indium precursor, before the substrate is contacted with the vapor phase gallium precursor, before the substrate is contacted with the vapor phase zinc precursor and/or before the substrate is contacted with a dopant precursor. Thus, active surface states on the substrate are deactivated to form deactivated surface states. It shall be understood that active surface states readily react with the vapor phase indium precursor, the vapor phase gallium precursor, the vapor phase zinc precursor, and/or one or more dopant precursors. Conversely, it shall be understood that the deactivated surface states do not substantially react with the vapor phase indium precursor, the vapor phase gallium precursor, the vapor phase zinc precursor, and/or any dopant precursors that are used.

In some embodiments, the surface modification step is carried out prior to contacting the substrate with any precursor. In other words, in some embodiments, the substrate is contacted with a surface modification agent before the substrate is contacted with an indium precursor, and the substrate is contacted with a surface modification agent before the substrate is contacted with a gallium precursor, and the substrate is contacted with a surface modification agent before the substrate is contacted with a zinc precursor.

In some embodiments, the surface modification agent may react with OH groups on the substrate surface. Exemplary surface modification agents include alcohols and acid anhydrides. Suitable alcohols include methanol, ethanol, and/or isopropanol. Suitable acid anhydrides include formic anhydride and acetic anhydride.

In an exemplary embodiment, a method as described herein comprises forming a layer by cyclically executing one or more super-cycles comprising the following steps belonging to a first sub-cycle: a substrate having a surface terminated with reactive surface terminations, e.g. having an OH-terminated surface, is exposed to a surface modification agent which de-activates a part of the reactive surface terminations. Optionally, the reaction chamber containing the substrate is subsequently purged. Then, the surface is exposed to a first precursor (e.g. a zinc precursor, a gallium precursor, or an indium precursor). The first precursor only reacts with active, i.e. non-deactivated, reactive surface terminations. Optionally, the reaction chamber containing the substrate is then purged. Then, the substrate is exposed to a co-reactant such as H$_2$O or O$_3$, which results in the regeneration of the reactive surface terminations. Optionally, the reaction chamber containing the substrate is subsequently purged. Thus a layer comprising an oxide of a first element, e.g. zinc oxide, gallium oxide, or indium oxide is formed, and its growth rate can be suitably controlled (i.e. reduced) by means of the surface modification agent.

In another exemplary embodiment, the super-cycles further comprise a second sub-cycle which comprises exposing the substrate to the surface modification agent which then de-activates a part of the reactive surface terminations. Then, the surface is exposed to a second precursor (e.g. a zinc precursor, a gallium precursor, or an indium precursor) which only reacts with the active reactive surface terminations. Optionally, the reaction chamber containing the substrate is then purged. Then, the substrate is exposed to a co-reactant such as $H_2O$ or $O_3$, which results in the regeneration of the reactive surface terminations. Optionally, the reaction chamber containing the substrate is subsequently purged. Thus a layer comprising a mixture of a first oxide and a second oxide is formed, and its growth rate can be suitably controlled (i.e. reduced) by means of the surface modification agent. When the use of the surface modification agent is omitted from the first or the second sub-cycle, the composition of the layer can be effectively controlled.

In another exemplary embodiment, the super-cycles further comprise a third sub-cycle which comprises exposing the substrate to the surface modification agent which then de-activates a part of the reactive surface terminations. Then, the surface is exposed to a third precursor (e.g. a zinc precursor, a gallium precursor, or an indium precursor) which only reacts with the active reactive surface terminations. Optionally, the reaction chamber containing the substrate is then purged. Then, the substrate is exposed to a co-reactant such as $H_2O$ or $O_3$, which results in the regeneration of the reactive surface terminations. Optionally, the reaction chamber containing the substrate is subsequently purged. Thus a layer comprising a mixture of a first oxide, a second oxide, and a third oxide is formed, and its growth rate can be suitably controlled (i.e. reduced) by means of the surface modification agent. When the use of the surface modification agent is omitted from one or two sub-cycles chosen from the first, the second, and the third sub-cycle, the composition of the layer can be effectively controlled.

In some embodiments, the substrate is exposed to two or more precursors simultaneously after the substrate has been exposed to the surface modification agent.

In some embodiments, the first, second, and/or third sub-cycles are repeated two or more times within a given super cycle. This provides another way of influencing the composition of the layer.

Note that a desired film thickness can be achieved by repeating the super-cycle a number of times.

When a surface deactivation agent is used, suitable process temperatures include temperatures at which the surface deactivation agent does not substantially react with the precursors that are used. Suitable temperatures include, for example, temperatures lower than 200° C., In some embodiments the indium precursor comprises trimethyl indium (TMIn). In some embodiments the indium precursor comprises trimethyl indium. In some embodiments the indium precursor comprises In(acac). In some embodiments the indium precursor comprises an indium cyclopentadienyl (InCp). In some embodiments the indium precursor comprises an indium halide, such as $InCl_3$. In some embodiments the indium compound may be a metal-organic or organometallic In-compound, for example with a direct bond from In to a ligand comprising an organic part or a direct In—C bond. In some embodiments, the indium precursor comprises an indium alkyl. In some embodiments, the indium precursor comprises an indium beta diketonate.

In some embodiments the gallium precursor comprises a gallium amide or alkylamide compound. In some embodiments the gallium compound is tris(dimethylamido)gallium ($Ga(NMe_2)_3$; TDMAGa). In some embodiments the compound is tris(diethylamidogallium ($Ga(NEt_2)_3$; TDEAGa). In some embodiments the gallium compound is or tris (ethylmethylamido) gallium ($Ga(NEtMe)_3$; TEMAGa). In some embodiments the gallium compound, such as $Ga(NMe_2)_3$, $Ga(NEt_2)_3$ or $Ga(NEtMe)_3$ may be in the form of a dimer. In some embodiments the gallium compound, such as $Ga(NMe_2)_3$, $Ga(NEt_2)_3$ or $Ga(NEtMe)_3$ may be monomeric in the gas phase. For example, in some embodiments the gallium compound may comprise $Ga_2(NMe_2)_6$ and may have the following Formula I in the gas phase:

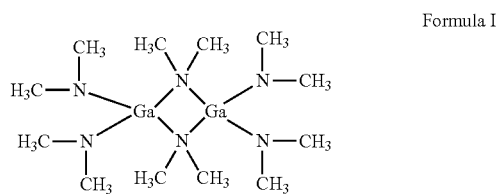

Formula I

In some embodiments the gallium compound may be gallium(III) isopropoxide. In some embodiments the gallium compound may be trimethylgallium. In some embodiments the gallium compound may be triethylgallium. In some embodiments the gallium compound may be selected from gallium triacetate, gallium acetylacetonate ($Ga(acac)_3$), Tris (2,2,6,6,-tetramethylheptane-3,5-dionato)gallium ($Ga(thd)_3$), and tris(1,1,1,5,5,5-hexafluoropentane-2,4-dionato)gallium ($Ga(hfac)_3$). In some embodiments the gallium compound may be a metal-organic or organometallic Ga-compound, such as a Ga compound having a direct bond to from Ga to a ligand comprising an organic part or a direct Ga—C bond.

In some embodiments the gallium compound comprises a carboxylate ligand. For example the gallium compound may be a gallium carboxylate, such as gallium formate, gallium acetate or gallium propionate.

In some embodiments the zinc precursor comprises one or more of elemental Zn, Zn halides, such as $ZnCl_2$, and alkyl zinc compounds such as $Zn(Et)_2$ or $Zn(Me)_2$. In some embodiments the zinc precursor is diethyl zinc (DEZ). In some embodiments the zinc compound may be a metal-organic or organometallic Zn-compound, such as one having a direct bond to from Zn to a ligand comprising an organic part or a direct Zn—C bond.

In some embodiments the oxygen reactant comprises one or more of water, ozone, $H_2O_2$, $O_2$, oxygen radicals, oxygen plasma, $NO_2$, $N_2O$ and other compounds comprising N and O, but not metals or semimetals. In some embodiments the oxygen reactant is water. In some embodiments the oxygen reactant is $N_2O$. In some embodiments, such as described above, one or more oxygen reactants are used in the deposition processes to react with one or more indium, zinc or gallium precursors to form the respective oxides. For example, the oxygen reactant may be used in a in binary oxide sub-cycle with one of an indium, zinc or gallium precursor, or in a multicomponent oxide sub-cycle, such as a sub-cycle that forms IZO, GZO or IGZO, for example, for tuning the stoichiometry or composition or desired properties of the films.

The zinc, indium and gallium precursors employed in the ALD type processes may be solid, liquid, or gaseous material under standard conditions (room temperature and atmospheric pressure), provided that the precursors are in vapor phase before being conducted into the reaction chamber and contacted with the substrate surface. In some embodiments diethyl zinc (DEZ) is used as the zinc source and is heated up to about 40° C. In some embodiments trimethyl indium (TMIn) is used as an indum source and is heated up to about 40° C. In some embodiments DEZ and/or TMIn are used at room temperature. In some embodiments tris(dimethylamino)gallium is used as the gallium source and is heated to above about 70° C.

"Pulsing" a vaporized precursor onto the substrate means that the precursor vapor is conducted into the chamber for a limited period of time. Depending on the specific process, the pulsing time is from about 0.05 seconds to about 10 seconds. However, depending on the substrate type and its surface area, the pulsing time may be even higher than about 10 seconds. In some embodiments the pulsing time may be from about 0.05 seconds to about 60 seconds or even up to about 120 seconds, such as in a batch approach.

For example, for a 300 mm wafer in a single wafer ALD reactor, the zinc, indium or gallium precursor may be pulsed for from about 0.05 seconds to about 10 seconds, for from about 0.1 seconds to about 5 seconds or for from about 0.3 seconds to about 3.0 seconds. The oxygen-containing precursor may be pulsed, for example, for from about 0.05 seconds to about 10 seconds, for from about 0.1 seconds to about 5 seconds, or for from about 0.2 seconds to about 3.0 seconds. However, pulsing times can be on the order of minutes in some cases. The optimum pulsing time can be readily determined by the skilled artisan based on the particular circumstances.

Before starting the deposition of the film, the substrate is typically heated to a suitable growth temperature, as discussed above. The deposition temperature may vary depending on a number of factors such as, and without limitation, the reactant precursors, the pressure, flow rate, the arrangement of the reactor, and the composition of the substrate including the nature of the material to be deposited on.

In some embodiments an IGZO film is deposited to a thickness of 200 nm or less, about 100 nm or less, about 50 nm or less, about 30 nm or less, about 20 nm or less, about 10 nm or less, about 5 nm or less or about 3 nm or less. The IGZO film will comprise at least the material deposited in one deposition cycle.

Atomic layer deposition allows for conformal deposition of IGZO films. In some embodiments, the IGZO films deposited by the processes disclosed herein on a three-dimensional structure have at least 90%, 95% or higher conformality. In some embodiments the films are about 100% conformal.

In some embodiments, the IGZO film formed has step coverage of more than about 80%, more than about 90%, and more than about 95% in structures which have high aspect ratios. In some embodiments high aspect ratio structures have an aspect ratio that is more than about 3:1 when comparing the depth or height to the width of the feature. In some embodiments the structures have an aspect ratio of more than about 5:1, an aspect ratio of 10:1, an aspect ratio of 20:1, an aspect ratio of 40:1, an aspect ratio of 60:1, an aspect ratio of 80:1, an aspect ratio of 100:1, an aspect ratio of 150:1, an aspect ratio of 200:1 or greater.

In some embodiments, the IGZO film formed has carbon impurities less than 20 at-%, less than 10 at-%, less than 5 at-%, less than 2 at-%, less than 1 at-% or less than 0.5 at-%. In some embodiments, the IGZO film formed has hydrogen impurities less than 30 at-%, less than 20 at-%, less than 10 at-%, less than 5 at-%, less than 3 at-% or less than 1 at-%.

In some embodiments, the IGZO film formed has stoichiometry or elemental ratio (In:Ga:Zn) of about 1:1:1, or from 0.1:1:1 to 10:1:1, or from 1:0.1:1 to 1:10:1, or from 1:1:0.1 to 1:1:10, or from 0.1:0.1:1 to 10:10:1, or from 0.1:1:0.1 to 10:1:10, or from 1:0.1:0.1 to 1:10:10. In some embodiments, the IGZO film formed has stoichiometry or elemental ratio (In:Ga:Zn) from 0.01:1:1 to 100:1:1, or from 1:0.01:1 to 1:100:1, or from 1:1:0.01 to 1:1:100, or from 0.01:0.01:1 to 100:100:1, or from 0.01:1:0.01 to 100:1:100, or from 1:0.01:0.01 to 1:100:100. The same ratios can be achieved with GZO, IGO and IZO films, respectively (without the metal component that's not included).

In some embodiments, the IGZO film formed has a cerium concentration of at least 0.1 atomic % to at most 10.0 atomic %, or of at least 0.1 atomic % to at most 0.5 atomic %, or of at least 0.5 atomic % to at most 1.0 atomic %, or of at least 1.0 atomic % to at most 2.0 atomic %, or of at least 2.0 atomic % to at most 5.0 atomic %, or of at least 5.0 atomic % to at most 10.0 atomic %.

In some embodiments, the IGZO film formed has a tantalum concentration of at least 0.1 atomic % to at most 10.0 atomic %, or of at least 0.1 atomic % to at most 0.5 atomic %, or of at least 0.5 atomic % to at most 1.0 atomic %, or of at least 1.0 atomic % to at most 2.0 atomic %, or of at least 2.0 atomic % to at most 5.0 atomic %, or of at least 5.0 atomic % to at most 10.0 atomic %.

In some embodiments, the IGZO film formed has uniformity of less than 10%, less than 5%, less than 2%, less than 1% or less than 0.5% (1sigma standard deviation) in 200 or 300 mm wafers or other substrates like square substrates.

In some embodiments, the IGZO film formed has elemental compositional non-uniformity (metal atom concentration non-uniformity) across the direction of the substrate surface of less than 30%, less than 20%, less than 10%, less than 5%, less than 2%, less than 1% or less than 0.5% (1sigma standard deviation) in 200 or 300 mm wafers or other substrates like square substrates.

In some embodiments, the IGZO films deposited by processes disclosed herein are annealed after the deposition, as desired depending on the application. In some embodiments the IGZO films are annealed in an oxygen environment. For example, the films may be annealed at an elevated temperature in water, $O_2$ or any of the other oxygen reactants mentioned above. In some embodiments the films may be annealed in an oxygen reactant comprising oxygen plasma, oxygen radicals, atomic oxygen or excited species of oxygen. In some embodiments the films are annealed in a hydrogen containing environment or in an inert atmosphere, such as a $N_2$, Ar or He atmosphere. In some embodiments, the films are annealed in forming gas. In some embodiments an annealing step is not carried out.

In some embodiments, following IGZO deposition, a further film is deposited. The additional film may be directly over and contacting the ALD-deposited IGZO layer.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. An atomic layer deposition (ALD) process for forming an indium gallium zinc oxide (IGZO) channel layer in a transistor device, the ALD process comprising a deposition cycle comprising alternately and sequentially contacting a substrate in a reaction space with a vapor phase indium precursor, a vapor phase gallium precursor, a vapor phase zinc precursor and an oxygen reactant, and repeating the deposition cycle until a IGZO thin film of a desired thickness has been formed, wherein the deposition cycle comprises a zinc indium oxide sub-cycle that is repeated N1 times and comprises alternately and sequentially contacting the substrate with the zinc precursor, the indium precursor and the oxygen reactant and a gallium oxide sub-cycle that is repeated N2 times and comprises alternately and sequentially contacting the substrate with the gallium precursor and the oxygen reactant, where N is an integer.

2. The process of claim 1, wherein the gallium precursor comprises at least one amine or alkylamine ligand.

3. The process of claim 1, wherein the zinc precursor comprises one or more of elemental zinc, a zinc halide, and an alkyl zinc compound.

4. The process of claim 1, wherein the indium precursor comprises one or more of an indium alkyl, an indium beta diketonate, an indium cyclopentadienyl, and an indium halide.

5. The process of claim 1, wherein the indium precursor is trimethyl indium, the zinc precursor is diethyl zinc and the gallium precursor is $Ga(NMe_2)_3$.

6. The process of claim 1, wherein the substrate is contacted with a surface modification agent before the substrate is contacted with the vapor phase indium precursor, before the substrate is contacted with the vapor phase gallium precursor, and/or before the substrate is contacted with the vapor phase zinc precursor.

7. The process of claim 6, wherein the surface modification agent reacts with OH groups on the substrate surface and wherein the surface modification agent comprises an alcohol or acid anhydride.

8. The process of claim 1, wherein the substrate is contacted with a dopant precursor comprising a cerium precursor, a tantalum precursor, a silicon precursor, and/or a germanium precursor.

9. An atomic layer deposition (ALD) process for forming an indium gallium zinc oxide (IGZO) channel layer in a transistor device, the ALD process comprising a deposition cycle comprising alternately and sequentially contacting a substrate in a reaction space with a vapor phase indium precursor, a vapor phase gallium precursor, a vapor phase zinc precursor and an oxygen reactant, and repeating the deposition cycle until a IGZO thin film of a desired thickness has been formed, wherein the deposition cycle comprises a zinc gallium oxide sub-cycle that is repeated N1 times and comprises alternately and sequentially contacting the substrate with the zinc precursor, the gallium precursor and the oxygen reactant; and an indium oxide sub-cycle that is repeated N2 times and comprises alternately and sequentially contacting the substrate with the indium precursor and the oxygen reactant, where N is an integer.

10. The process of claim 9, wherein the gallium precursor comprises at least one amine or alkylamine ligand.

11. The process of claim 9, wherein the zinc precursor comprises one or more of elemental zinc, a zinc halide, and an alkyl zinc compound.

12. The process of claim 9, wherein the indium precursor comprises one or more of an indium alkyl, an indium beta diketonate, an indium cyclopentadienyl, and an indium halide.

13. The process of claim 9, wherein the indium precursor is trimethyl indium, the zinc precursor is diethyl zinc and the gallium precursor is $Ga(NMe_2)_3$.

14. The process of claim 9, wherein the substrate is contacted with a surface modification agent before the substrate is contacted with the vapor phase indium precursor, before the substrate is contacted with the vapor phase gallium precursor, and/or before the substrate is contacted with the vapor phase zinc precursor.

15. The process of claim 14, wherein the surface modification agent reacts with OH groups on the substrate surface and wherein the surface modification agent comprises an alcohol or acid anhydride.

16. The process of claim 9, wherein the substrate is contacted with a dopant precursor comprising a cerium precursor, a tantalum precursor, a silicon precursor, and/or a germanium precursor.

17. An atomic layer deposition (ALD) process for forming an indium gallium zinc oxide (IGZO) channel layer in a transistor device, the ALD process comprising a deposition cycle comprising alternately and sequentially contacting a substrate in a reaction space with a vapor phase indium precursor, a vapor phase gallium precursor, a vapor phase zinc precursor and an oxygen reactant, and repeating the deposition cycle until a IGZO thin film of a desired thickness has been formed, wherein the deposition cycle comprises a zinc oxide sub-cycle that is repeated N1 times and comprises alternately and sequentially contacting the substrate with the zinc precursor and the oxygen reactant; and an indium gallium oxide sub-cycle that is repeated N2 times and comprises alternately and sequentially contacting the substrate with the indium precursor and the gallium precursor and the oxygen reactant, where N is an integer.

18. The process of claim 17, wherein the gallium precursor comprises at least one amine or alkylamine ligand.

19. The process of claim 17, wherein the zinc precursor comprises one or more of elemental zinc, a zinc halide, and an alkyl zinc compound.

20. The process of claim 17, wherein the indium precursor comprises one or more of an indium alkyl, an indium beta diketonate, an indium cyclopentadienyl, and an indium halide.

21. The process of claim 17, wherein the indium precursor is trimethyl indium, the zinc precursor is diethyl zinc and the gallium precursor is $Ga(NMe_2)_3$.

22. The process of claim 21, wherein the surface modification agent reacts with OH groups on the substrate surface and wherein the surface modification agent comprises an alcohol or acid anhydride.

23. The process of claim 22, wherein the surface modification agent reacts with OH groups on the substrate surface and wherein the surface modification agent comprises an alcohol or acid anhydride.

24. The process of claim 17, wherein the substrate is contacted with a dopant precursor comprising a cerium precursor, a tantalum precursor, a silicon precursor, and/or a germanium precursor.

* * * * *